US009199826B2

(12) United States Patent
Shibata et al.

(10) Patent No.: US 9,199,826 B2
(45) Date of Patent: Dec. 1, 2015

(54) ARTICLE TRANSPORT FACILITY

(75) Inventors: Suguru Shibata, Komaki (JP); Daisuke Ogawa, Kasugai (JP); Yoshitaka Inui, Omihachiman (JP)

(73) Assignee: Daifuku Co., Ltd., Osaka-shi (JP)

( * ) Notice: Subject to any disclaimer, the term of this patent is extended or adjusted under 35 U.S.C. 154(b) by 220 days.

(21) Appl. No.: 13/813,788

(22) PCT Filed: Jun. 17, 2011

(86) PCT No.: PCT/JP2011/063892
§ 371 (c)(1),
(2), (4) Date: Apr. 2, 2013

(87) PCT Pub. No.: WO2012/017743
PCT Pub. Date: Feb. 9, 2012

(65) Prior Publication Data
US 2013/0195588 A1 Aug. 1, 2013

(30) Foreign Application Priority Data
Aug. 4, 2010 (JP) .................................. 2010-175563

(51) Int. Cl.
*B66C 19/00* (2006.01)
*H01L 21/677* (2006.01)

(52) U.S. Cl.
CPC .............. *B66C 19/00* (2013.01); *H01L 21/677* (2013.01); *H01L 21/67727* (2013.01); *H01L 21/67733* (2013.01); *H01L 21/67736* (2013.01)

(58) Field of Classification Search
CPC .................. H01L 21/67733; H01L 21/67715; H01L 21/67727; H01L 21/677; H01L 21/67736; B65G 37/02; B65G 2201/0297; B66C 19/00

USPC ............. 104/89, 91, 93, 95, 96, 98, 127, 128, 104/129, 130.04; 414/222.13; 198/370.01
See application file for complete search history.

(56) References Cited

U.S. PATENT DOCUMENTS

| RE28,306 E | * | 1/1975 | Burke ............................ 104/298 |
| 4,706,782 A | * | 11/1987 | Spoeler et al. ................ 187/403 |
| 4,841,871 A | * | 6/1989 | Leibowitz ..................... 104/23.1 |
| 2004/0149158 A1 | * | 8/2004 | Keller et al. .................... 104/89 |

FOREIGN PATENT DOCUMENTS

| JP | 04366201 A | 12/1992 |
| JP | 05010331 U | 2/1993 |
| JP | 08157049 A | 6/1996 |
| JP | 2006313463 A | 11/2006 |
| JP | 2006319154 A | 11/2006 |

* cited by examiner

*Primary Examiner* — Mark Le
(74) *Attorney, Agent, or Firm* — The Webb Law Firm

(57) ABSTRACT

An article transport facility in which reduction in the transport capacity can be prevented while simplifying the structure and making the facility less expensive is provided. The facility includes, as travel paths, a first travel path and a second travel path which straddles the first travel path from one side to the other side in a lateral direction of the first travel path. In a straddling portion, which is a part of the second travel path that straddles the first travel path, the second travel path is provided at a different height from the first travel path in a vertical direction, and is configured such that travel of the article transport vehicle along the first travel path and travel of the article transport vehicle along the second travel path are mutually allowed.

7 Claims, 9 Drawing Sheets

ARTICLE TRANSPORT FACILITY

TECHNICAL FIELD

The present invention relates to an article transport facility in which an article transport vehicle is provided which can travel along a travel rail which defines travel paths.

BACKGROUND ART

In article transport facilities such as one described above, for example, a loop-shaped primary path and secondary paths are provided as the travel paths where each secondary path extends along, or by way of, a plurality of article transport locations and is connected to the primary path such that article transport vehicles can diverge from and converge into the primary path. And the secondary paths are spaced apart from each other in the travel direction of the article transport vehicles as they travel along the primary path, and are provided outside and on both lateral sides of the primary path. (See, for example, Patent Document 1.)

Articles are sometimes transported from a secondary path on one side of the primary path to a secondary path on the other side in the facility that includes such primary path and secondary paths. In such cases, an article transport vehicle would travel along the primary path after converging into the primary path from the secondary path on one side, and would have to travel along the loop-shaped primary path to the diverging location into the secondary path located on the other side of the primary path, which results in an increased travel distance for the article transport vehicle. Therefore, transporting of articles cannot be performed efficiently, which leads to a reduction in the transport capacity. In addition, because other article transport vehicles also travel along the primary path and the secondary paths, the area covered by an article transport vehicle may interfere with the areas covered by other article transport vehicles as the distances traveled by the article transport vehicles increase. Thus, it becomes impossible for the article transport vehicle to travel smoothly due to restrictions imposed by other traveling article transport vehicles. Therefore, transport capacity can be reduced as the travel distances of the article transport vehicles increase also for this reason.

To this end, in the facility described in Patent Document 1 described above, transport conveyers are provided, each of which can transport an article between an article transport vehicle in a secondary path on one side of the primary path and an article transport vehicle in a secondary path on the other side of the primary path. This allows articles to be transported from a secondary path on one side of the primary path to a secondary path on the other side by transporting the articles with the transport conveyer while preventing increase in the distances traveled by the article transport vehicles. More specifically, an article is transferred from the article transport vehicle in the secondary path on the one side to the transport conveyer. The article is then transported by the transport conveyer to another secondary path on the opposite side of the primary path. And the article transport vehicle in the secondary path on the other side transports the article to a desired location after receiving the article transported by the transport conveyer.

PRIOR ART REFERENCES

Patent Documents

Patent Document 1: JP Publication of Application No. 2006-319154

SUMMARY OF THE INVENTION

Problems to be Solved by the Invention

In the facility described in Patent Document 1 described above, transport conveyers are provided each of which can transport an article between an article transport vehicle in a secondary path on one side of the primary path and an article transport vehicle in a secondary path on the other side in order to prevent increase in the distances traveled by the article transport vehicles. However, the transport conveyers have to be provided as devices for transporting articles in addition to the article transport vehicles, which makes the structure more complex and more expensive. In addition, while the articles would be transported by the transport conveyers between the secondary paths on one side of the primary path and the secondary paths on the other side, the transport speed of the transport conveyers is limited and cannot be increased to a comparatively high speed, such as the travel speed of the article transport vehicle. Thus, the time required to transport articles increases. And there is a possibility that transport capacity may decrease contrary to the intended purpose.

The present invention was made in light of this issue and its object is to provide an article transport facility in which reduction in the transport capacity can be prevented while simplifying the structure and making the facility less expensive.

Means for Solving the Problems

In order to achieve the object, an article transport facility in accordance with the present invention comprises:

the travel paths including a first travel path and a second travel path which straddles the first travel path from one side to the other side in a lateral direction of the first travel path;

an article transport vehicle capable of traveling along the travel paths;

characterized in that in a straddling portion, which is a part of the second travel path that straddles the first travel path, the second travel path is provided at a different height from the first travel path in a vertical direction and is configured such that travel of the article transport vehicle along the first travel path and travel of the article transport vehicle along the second travel path are mutually allowed, wherein the article transport vehicle is configured to be able to travel along the second travel path sequentially from one side in the lateral direction of the first travel path, through the straddling portion, and to other side in the lateral direction of the first travel path.

With such a configuration, the second travel path is provided at a different height from the first travel path in the vertical direction in the straddling portion of the second travel path and is configured such that travel of the article transport vehicle along the first travel path and travel of the article transport vehicle along the second travel path are mutually allowed; thus, the travel of the article transport vehicle along the first travel path and the travel of the article transport vehicle along the second travel path can be performed independently of each other without interfering with each other.

And since the article transport vehicle is configured to be able to travel along the second travel path sequentially from one side in the lateral direction of the first travel path, through the straddling portion, and to other side in the lateral direction of the first travel path, the article transport vehicle can travel over or under the first travel path by traveling along the second travel path. In a facility having a primary path and secondary paths, such as one described in Patent Document 1 above, for example, a primary path can be defined as the first travel path. And the second travel path may be provided which straddles the primary path as a travel path that connects together a secondary path on one side of the primary path and a secondary path on the other side. Thus, in a facility having the first travel path and the second travel paths, the article transport vehicle can travel between the secondary path on one side and the secondary path of the other side by traveling along the second travel path without having to travel along the primary path which functions as the first travel path. Therefore, an article can be transported by the article transport vehicle from the secondary path of one side of the primary path to the secondary path on the other side while reducing the distance traveled by the article transport vehicle by providing the second travel path that straddles the first travel path, without having to provide a transport conveyer as in the facility described in Patent Document 1 described above. In addition, since the article can be transported by the traveling of the article transport vehicle from the secondary path on one side of the primary path to the secondary path on the other side, the transport speed at this time can be comparatively high, such as the travel speed of the article transport vehicle. Thus, an article can be transported at a transport speed higher than the transport speed of, for example, a transport conveyer.

For this reason, an article transport facility can be provided in which the distance traveled by the article transport vehicle can be reduced and the transport speed can also be comparatively high so that reduction in the transport capacity can be prevented while simplifying the structure and making the facility less expensive.

In an embodiment of the article transport facility in accordance with the present invention, as the travel path, a third travel path is preferably provided which diverges from the first travel path and converges into the first travel path wherein the third travel path is provided on each of one side and the other side of the first travel path in the lateral direction of the first travel path, wherein the second travel path preferably has one end portion thereof connected to the third travel path that is provided on one side in the lateral direction of the first travel path, and the other end thereof connected to the third travel path that is provided on the other side in the lateral direction of the first travel path so as to allow the article transport vehicle to travel between the third travel path that is provided on the one side and the third travel path that is provided on the other side in the lateral direction of the first travel path.

With such a configuration, because the second travel path is configured to allow the article transport vehicle to travel between the third travel path that is provided on one side and the third travel path that is provided on the other side in the facility in which the third travel path is provided in each of one side and the other side of the first travel path, the article transport vehicle can travel along the second travel path to travel over or under the first travel path and between the third travel path that is provided on one side and the third travel path that is provided on the other side when transporting an article between the third travel path that is provided on the one side and the third travel path that is provided on the other side. Therefore, in the facility in which the third travel path is provided in each of one side and the other side of the first travel path, reduction in the transport capacity due to increase in the distance traveled by the article transport vehicle can be prevented; thus, useful facility can be provided.

In an embodiment of the article transport facility in accordance with the present invention, a first travel rail which defines the first travel path and a second travel rail which defines the second travel path are preferably provided, wherein the second travel rail preferably includes a first height rail portion provided on one side and the other side in the lateral direction of the first travel path and at a same height as the first travel rail in the vertical direction, a second height rail portion provided in the straddling portion at a different height from the first travel rail in the vertical direction, and a vertically movable rail portion which can be vertically moved by a vertically moving device between a first height at which the vertically movable rail portion is in series with the first height rail portion and a second height at which the vertically movable rail portion is in series with the second height rail portion wherein the vertically movable rail portion is preferably provided between the straddling portion and one side in the lateral direction of the first travel path and between the straddling portion and the other side in the lateral direction of the first travel path.

With such a configuration, by locating the vertically movable rail portion at the first height with the vertically moving device, the article transport vehicle can travel to move from the first height rail portion onto the vertically movable rail portion. And once the article transport vehicle has moved onto the vertically movable rail portion, the article transport vehicle can travel to move from the vertically movable rail portion located at the second height to the second height rail portion by raising the vertically movable rail portion from the first height to the second height with the vertically moving device. In this manner, by vertically moving the vertically movable rail portion between the first height and the second height, the article transport vehicle can travel to move between the first height rail portion and the vertically movable rail portion as well as between the vertically movable rail portion and the second height rail portion so that the article transport vehicle can travel over or under the first travel path defined by the first travel rail and along the second travel path defined by the second travel rail. Therefore, the article transport vehicle properly travel along the second travel path over or under the first travel path.

In an embodiment of the article transport facility in accordance with the present invention, the first travel rail and the second travel rail are preferably provided as a pair of right and left first travel rails and a pair of right and left second travel rails respectively, wherein the vertically moving device is preferably configured to be able to vertically move the vertically movable rail portion between the first height and the second height using driving force of an actuator, wherein the actuator is preferably accommodated in space on a side in which the first height rail portion is provided with respect to the vertically movable rail portion in the lateral direction of the first travel path, and within the range of vertical movement in which the vertically movable rail portion is vertically moved between the first height and the second height in the vertical direction, and between the pair of right and left second travel rails in the lateral direction of the second travel path.

The vertically movable rail portion is vertically moved between the first height and the second height as described above. And formed on a side in which the first height rail portion is provided with respect to the vertically movable rail portion in the lateral direction of the first travel path, and above or below the first height rail portion is space which corresponds to the vertical movement range in which the vertically movable rail portion is vertically moved between the first height and the second height in the vertical direction. Thus, with the configuration described above, because the actuator of the vertically moving device is so located that it is accommodated within the vertical movement range in which the vertically movable rail portion is vertically moved between the first height and the second height in the vertical direction and on the side in which the first height rail portion is provided with respect to the vertically movable rail portion in the lateral direction of the first travel path, the space above or below the first height rail portion can be effectively utilized as space for installing the actuator. Further, since the actuator is provided such that it is accommodated within the space between the pair of right and left second travel rails in the lateral direction of the second travel path, the actuator is not projected and installed outside the pair of right and left second travel rails. Accordingly, the actuator can be efficiently installed in small space while effectively utilizing the space above or below the first height rail portion.

In addition, in an embodiment of the article transport facility in accordance with the present invention, a stopper for restricting movement of the article transport vehicle is preferably provided at least in the vertically movable rail portion, wherein the stopper can preferably be moved between a contact position for restricting passage of the article transport vehicle and a retracted positions for allowing passage of the article transport vehicle, wherein the stopper is preferably configured to be moved from the contact position to the retracted position by contacting a position changing operating portion supported on a ceiling side when the vertically movable rail portion reaches the second height.

Thus, the article transport vehicle located in the vertically movable rail portion can be prevented from moving out of the vertically movable rail portion while the vertically movable rail portion is moving. In addition, because the stopper is configured to be moved from the contact position to the retracted position by contacting a position changing operating portion supported on a ceiling side when the vertically movable rail portion reaches the second height, it is not necessary to provide an actuator for moving the stopper.

MODES FOR CARRYING OUT THE INVENTION

Embodiments of the article transport facility in accordance with the present invention are described next with reference to the drawings. In the present embodiment, an article transport facility in accordance with the present invention is used in a processing facility for processing semiconductor substrates, as an example. However, the article transport facility in accordance with the present invention is applicable to other facilities in which articles need to be transported.

Figure 1:
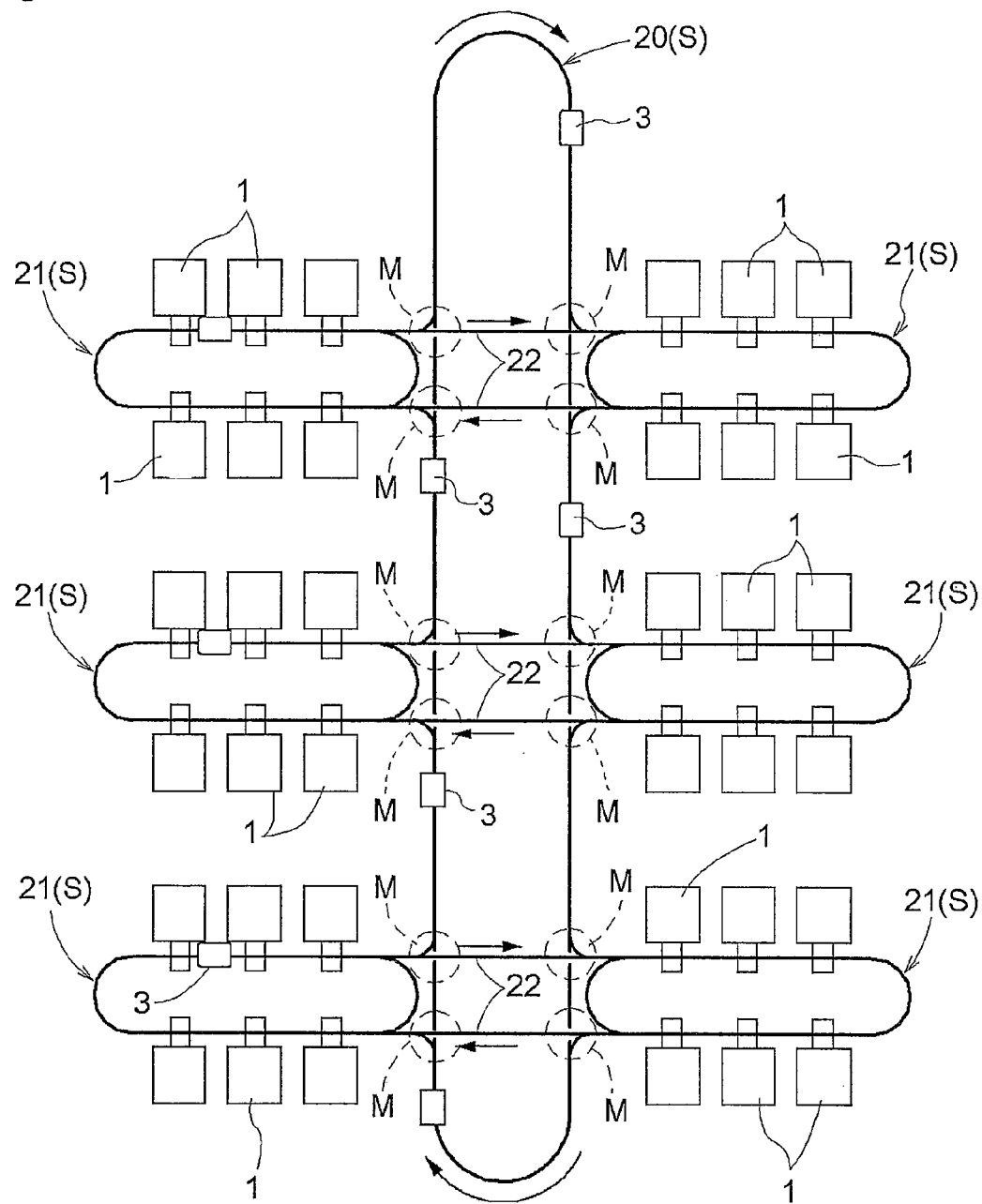
FIG. 1 is an overall plan view of an article transport facility.
Figure 2:
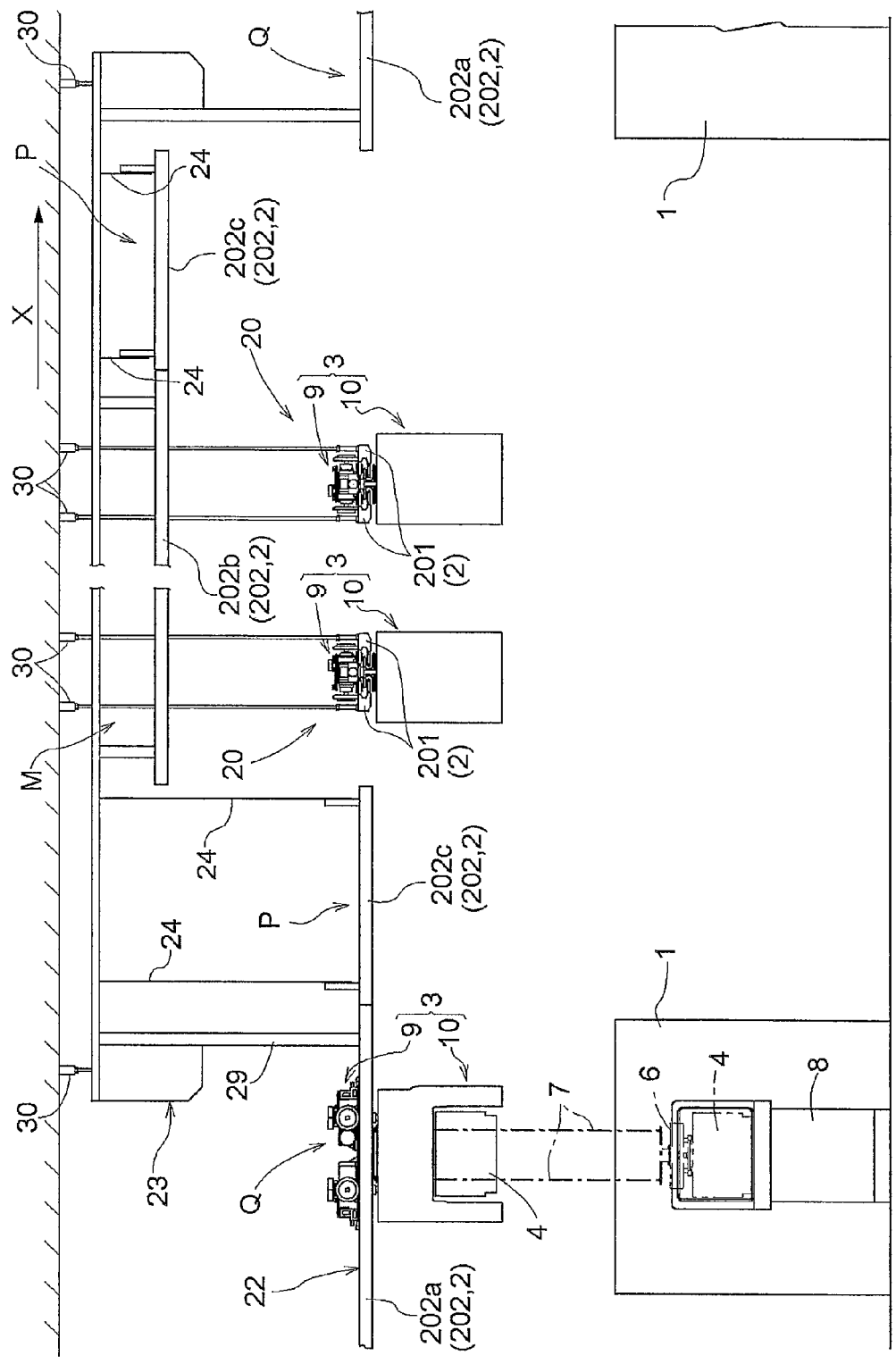
FIG. 2 is a side view of a part of the article transport facility.

In this article transport facility, as shown in FIG. 1, travel paths S are formed or defined by travel rails 2 which are installed on the ceiling side. And a plurality of article transport vehicles 3 of the ceiling transport type which can travel in one direction along the travel paths S are provided. In this article transport facility, as shown in FIG. 2, containers for storing semiconductor substrates are the articles 4. And the article transport vehicle 3 is configured to transport an article 4 among a plurality of article processors 1. The travel rails 2 are fixedly installed in the ceiling portion by means of suspending supports 30.

As shown in FIG. 2, the article transport vehicle 3 includes a grip portion 6 which suspends and grips an article 4 and which can be raised or lowered, or moved vertically. The grip portion 6 is configured to be moved vertically between a raised position which is close to the article transport vehicle 3 and a lowered position for performing article transfer to and from article transfer stations 8 installed below the article transport vehicle 3 by spooling and feeding out wires 7 (which are not limited to wires and, for example, belts may be used) with the article transport vehicle 3 stopped. Incidentally, FIG. 2 shows a case where the grip portion 6 is lowered to the lowered position from the raised position.

The station 8 includes a supporting platform which receives and supports an article 4. And the station 8 is provided for receiving from the article transport vehicle 3 an article 4 on which a predetermined processing is to be performed by the article processor 1 and also for delivering the article 4, on which the predetermined processing has been performed by the article processor 1, to the article transport vehicle 3. And a station 8 is provided in association with each of the plurality of article processors 1.

The article transport vehicle 3 is configured to travel along the travel rails 2 with the grip portion 6 located in the raised position and to deliver and receive (i.e., transfer) the article 4 to and from a station 8 by vertically moving the grip portion 6 between the raised position and the lowered position while stopped at a stop position associated with the station 8 that is the transfer target among the plurality of stations 8.

The article transport vehicle 3 is configured to include a travel drive portion 9 for traveling on the travel rails 2 and an article support 10 which is suspended and supported by the travel drive portion 9 such that the article support 10 is located under the travel rails 2.

Figure 3:
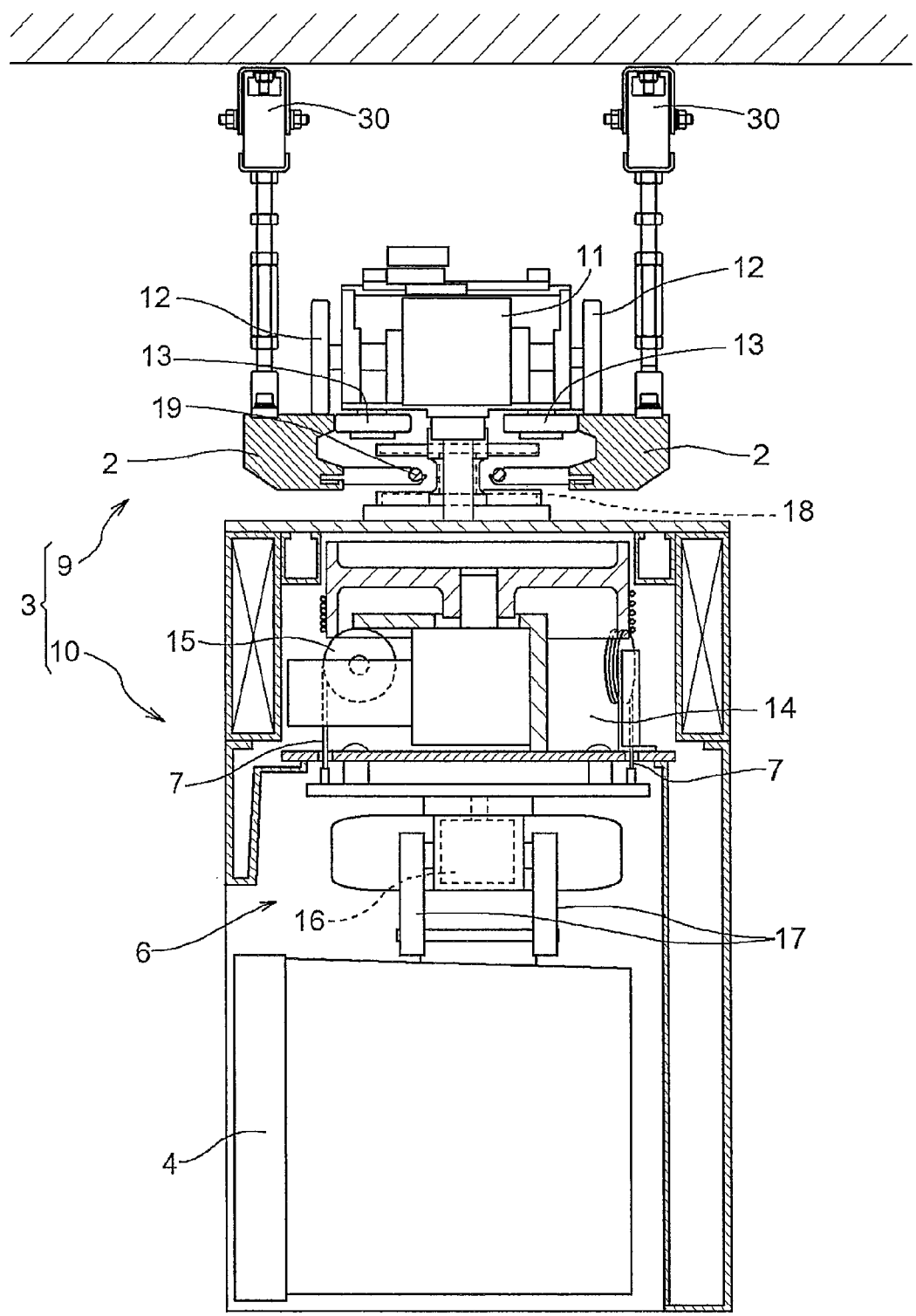
FIG. 3 is sectional view of an article transport vehicle as seen in the travel direction of the article transport vehicle.

As shown in FIG. 3, provided as the travel rails 2 are a pair of right and left travel rails 2 which are spaced apart from each other in a lateral direction of the article transport vehicle 3. And the travel drive portion 9 includes travel wheels 12 which are driven and rotated by drive motors 11 and which roll on respective top surfaces, that extend along a horizontal plane, of the pair of right and left travel rails 2, and travel guide wheels 13 which can be rotated freely and which are in contact with side faces, of the pair of right and left travel rails 2, that extend vertically and that face each other. And the article transport vehicle 3 is configured to travel while being guided by the travel rails 2 by virtue of the fact that the travel wheels 12 are driven and rotated by the drive motors 11 about axes that extend along the lateral direction of the article transport vehicle 3 and the fact that the travel guide wheels 13 which can be rotated freely about vertical axes are contacted and guided by the pair of right and left travel rails 2.

While not shown, the travel wheels 12 include two pairs of right and left travel wheels 12 with a total of four travel wheels 12, with each pair including right and left travel wheels 12 located at opposite ends in the lateral direction of the article transport vehicle 3, and with one pair of travel wheels 12 spaced apart from the other pair in a fore and aft direction of the article transport vehicle 3. The travel guide wheels 13 include two groups of travel guide wheels 13 with one group spaced apart from the other in the fore and aft direction of the article transport vehicle 3 with each group having two travel guide wheels 13 at each opposite end in the lateral direction of the article transport vehicle 3 with a total of eight travel guide wheels 13.

Referring back to FIG. 3, the article support 10 includes rotating drums 15 which spool the wires 7 and which are driven and rotated by vertical movement motors 14, and the grip portion 6 which is suspended and supported by the wires 7. The grip portion 6 includes a gripper 17 which can be switched by a gripper motor 16 between a gripping attitude for gripping an article 4 and a grip release attitude in which the grip is released. And the grip portion 6 and the article 4 gripped by the grip portion 6 are moved vertically by drivingly rotating the rotating drums 15 with the vertical movement motors 14 whereas the gripper 17 is configured to be switched by the gripper motor 16 to grip or release the grip on the article 4.

The article transport vehicle 3 includes a power receiving coil 18 in a central section in the fore and aft direction and the lateral direction of the article transport vehicle 3 and is configured to receive driving electric power from electricity supply lines 19 with this power receiving coil 18. One pair of right and left electricity supply lines 19 are provided such that they are supported by the travel rails 2. And the pair of right and left electricity supply lines 19 are located between the pair of right and left travel rails 2 such that they are spaced apart from each other in the lateral direction of the article transport vehicle 3. And magnetic field is generated by applying alternating currents to the electricity supply lines 19. The magnetic field causes driving electric power to be generated in the receiving coil 18 so that driving electric power is supplied to the article transport vehicle 3 without contact. With driving electric power supplied to the power receiving coil 18 from the electricity supply lines 19, the article transport vehicle 3 uses the driving electric power to cause the travel drive portion 9 to travel and cause the grip portion 6 to be moved vertically, among other things.

In this article transport facility, the travel paths S along which the article transport vehicle 3 travels is formed or defined by the travel rails 2. And as shown in FIG. 1, provided as the travel paths S are a loop-shaped primary path 20 (which functions as a first travel path) and loop-shaped secondary paths 21 (which function as third travel paths), and connecting paths which connect the primary path 20 and the secondary paths 21 and which allow the article transport vehicle 3 to diverge from the primary path 20 to a secondary path 21 and to converge from a secondary path 21 to the primary path 20.

The primary path 20 is configured as a loop-shaped path having a pair of straight portions that are located opposite each other and a pair of curved portions for connecting together respective terminating end portions and beginning end portions of the straight portions. The area in the vicinity of the pair of straight-line portions is divided into three areas by the pair of straight-line portions of the primary path 20. The first area of the divided areas is the inside area between the pair of straight-line portions. The second area is one of the two outside areas which are not included in the first area whereas the third area is the other of the two outside areas. A plurality of secondary paths 21 (for example, three secondary paths 21 as shown in FIG. 1) are located on the outside of the primary path 20, are spaced apart from each other in the travel direction of the article transport vehicle 3 in the primary path 20, and are located on one and the other side of the primary path 20. The secondary paths 21 are arranged such that the secondary paths 21 on one side of the primary path 20 and the secondary paths 21 on the other side of the primary path 20 are located at positions along the primary path 20 that are opposite each other.

Each secondary path 21 includes a straight portion that extends away from the primary path 20 and a straight portion that extends toward the primary path 20 such that they are located opposite each other and such that they extend along, or by way of, a plurality of stations 8. And each secondary path 21 has a shape of a loop with a pair of straight portions path 21 and a pair of curved portions which connect terminating end portions and beginning end portions of the pair of straight portions. Target stop positions for transferring articles 4 between respective stations 8 and the article transport vehicle 3 are defined at intermediate locations of the secondary path 21. The article transport vehicle 3 vertically moves the grip portion 6 to transfer an article 4 to and from a station 8 while stopped at a target stop position.

The connecting paths which connect the primary path 20 with a secondary path 21 are provided to each of the plurality of secondary paths 21. And the connecting paths consist of diverging paths each of which branches or breaks off from a straight portion of the primary path 20 and extends away from the primary path 20 and each of which is connected to a straight portion of the secondary path 21 as well as a merging path which joins or merges the primary path 20 from a terminating end portion of a straight portion of a secondary path 21 that extends toward the primary path 20. And in the primary path 20, the branching location of a diverging path is on an upstream side in the travel direction of the article transport vehicle 3 with respect to the merging location of the associated merging path. When the article transport vehicle 3 diverges to a secondary path 21 from the primary path 20, it continues to travel along the secondary path 21 from the travel direction in which it traveled in the primary path 20. Also, when the article transport vehicle 3 merges into the primary path 20 from a secondary path 21, it continues to travel along the secondary path 21 from the travel direction in which it traveled in the secondary path 21.

In this article transport facility, provided in addition to the connecting paths are inter-secondary-path connecting paths 22 (that function as second travel paths), each of which connects a secondary path 21 located on one side of the primary path 20 with a secondary path 21 located on the other side so that the article transport vehicle 3 can travel between the secondary path 21 located on one side of the primary path 20 and the secondary path 21 on the other side without having to travel along the primary path 20.

The inter-secondary-path connecting path 22 has its one end connected to the secondary path 21 located on one side of the primary path 20 and its the other end connected to the secondary path 21 located on the other side of the primary path 20, and its intermediate portion which straddles, or extends over or under, the primary path 20 from the one side of the primary path 20 to the other side in the lateral direction (i.e., lateral direction in FIG. 1, or the travel direction of the article transport vehicle 3 in the inter-secondary-path connecting path 22). In the present specification, an expression "a path portion straddling the primary path 20" means that the path portion in question extends from one side of the primary path 20 to the other side in plan view without merging into or branching off from the primary path 20. An inter-secondary-path connecting paths 22 consists of straight paths which connect secondary paths 21 located at positions in the primary path 20 that are opposite each other.

Two inter-secondary-path connecting paths 22 are provided to connect one secondary path 21 with another. This allows one of the two inter-secondary-path connecting paths 22 to be used as a path in which the article transport vehicle 3 is allowed to travel from the secondary path 21 on one side of the primary path 20 (for example, one on the left hand side in FIG. 1) to the secondary path 21 on the other side (for example, one on the right hand side in FIG. 1) and allows the other of the two inter-secondary-path connecting paths 22 to be used as a path in which the article transport vehicle 3 is allowed to travel from the secondary path 21 on the other side of the primary path 20 (for example, one on the right hand side in FIG. 1) to the secondary path 21 of the one side (for example, one on the left hand side in FIG. 1). Each of the two inter-secondary-path connecting paths 22 connecting one secondary path 21 with another has its beginning end side connected to the terminating end portion of the straight portion of the secondary path 21 on one side that extends toward the primary path 20, and its terminating end side connected to the beginning end portion of the straight portion of the secondary path 21 on the other side that extends away from the primary path 20. As shown by the arrows in FIG. 1, this allows the travel direction when traveling along the secondary path 21 on one side, the travel direction when traveling along the inter-secondary-path connecting path 22, and the travel direction when traveling along the secondary path 21 on the other side to be the same when the article transport vehicle 3 travels from the secondary path 21 on one side to the secondary path 21 on the other side along an inter-secondary-path connecting path 22, which allows for smooth travel from the secondary path 21 on one side to the secondary path 21 on the other side along the inter-secondary-path connecting path 22.

The inter-secondary-path connecting paths 22 are configured to straddle, or extend over or under, the primary path 20 and perpendicularly with each of the pair of straight portions of the primary path 20. The portion that straddles the straight portion of the primary path 20 is a straddling portion M. And in this straddling portion M, the vertical position at which the article transport vehicle 3 travels along the primary path 20 is different from the vertical position at which the article transport vehicle 3 travels along the inter-secondary-path connecting path 22. That is, the inter-secondary-path connecting paths 22 in straddling portions M are located higher than the primary path 20 in the straddling portions M. Therefore, travel of the article transport vehicle 3 along the primary path 20 and travel of the article transport vehicle 3 along an inter-secondary-path connecting path 22 can be performed without interfering with each other.

Regarding travel of a plurality of article transport vehicles 3, a facility management computer which manages operations of the plurality of movable bodies 3 over the entire travel paths S is provided, and each article transport vehicle 3 is provided with a carriage side controller which controls operation of the article transport vehicle 3 based on operation command information from the facility management computer. The controllers and operation management portion (described below), such as a computer in the present specification belong to conventional technology and have a CPU, memory, a communication unit, etc., in which algorithms for performing the functions described in the present specification are stored in memory.

While not shown, the article transport vehicle 3 has various sensors including, for example, a stop plate detection sensor for detecting stop plates which are installed, for example, in a side of a travel rail 2 to indicate the target stop position associated with each station 8, an absolute position plate detection sensor for detecting absolute position plates which indicate positions (or distance) from a reference point in the travel path S, which is installed, for example, in a side of a travel rail 2, and a travel distance sensor for detecting the distance traveled by the article transport vehicle 3. The carriage side controller keeps track of the current position of the article transport vehicle 3 in the travel paths S based on the detected information from the absolute position plate detection sensor and the detected information from the travel distance sensor after an absolute position plate detection sensor is detected, and transmits the current position information and carriage identifying information, such as, a carriage number which allows identification of the article transport vehicle among the plurality of article transport vehicles 3 to the facility management computer by, for example, wireless communication.

The facility management computer manages, or keeps track of, respective current positions of the plurality of article transport vehicles 3 based on the current position information and carriage identifying information from each carriage side controller to manage the operations of the plurality of article transport vehicles 3. The facility management computer is configured to select one transport vehicle 3 for transporting from the plurality of article transport vehicles 3, and to issue, as operation command information and to the selected article transport vehicle 3, a transport command, which specifies the station 8 of transport origin and the station 8 of transport destination among the plurality of stations 8, for transporting an article 4 from the station 8 of transport origin to the station 8 of transport destination. In addition, when causing the article transport vehicle 3 to travel from the transport origin to the transport destination, the facility management computer is configured to select from the plurality of paths the shortest route with the shortest travel distance, for example, and to issue operation command information for causing the article transport vehicle 3 to travel along the selected shortest route.

Thus, the carriage side controller of the article transport vehicle 3 that receives the transport command controls the travel of the article transport vehicle 3 to travel to the specified station 8 of transport origin and controls the vertical movement operation of the grip portion 6 and the switch operation of the grip portion 6, based on the detected information from various sensors to receive an article 4 from the station 8 of transport origin. Subsequently, the carriage side controller controls the travel of the article transport vehicle 3 to cause it to travel to the specified station 8 of transport destination based on the detected information from various sensors, and delivers the article 4 to the station 8 of transport destination.

As shown in FIG. 1, two or more locations such as converging portions are provided in each of which a certain path and another path merge each other. And a collision between article transport vehicles 3 may occur at locations such as the converging portions. To this end, as described above, the facility management computer basically manages the operations of the article transport vehicles 3 along the travel paths S. However, at such locations as the converging portions, an operation management portion is provided in addition to the facility management computer to manage operations of the article transport vehicles 3 so that the article transport vehicles 3 are allowed to travel while preventing collisions between article transport vehicles 3.

For example, when entering into a converging portion, the carriage side controller of the article transport vehicle 3 controls the traveling of the article transport vehicle 3 by inquiring the operation management portion and at a location before entering, as to whether the entry is permitted, and traveling into the converging portion only when the entry is permitted. On the other hand, when there is an inquiry from a carriage side controller as to whether an entry is permitted, the operation management portion issues operation command information to the carriage side controller to allow only one article transport vehicle 3 to enter the portion or the converging portion.

[Straddling Portions in Inter-Secondary-Path Connecting Paths]

As described above, in an inter-secondary-path connecting path 22, the portion that straddles the straight portions of the primary path 20 is the straddling portion M. As described above, in the article transport facility in accordance with the present invention, by arranging the vertical position at which the article transport vehicle 3 travels along the primary path 20 to be different, in the straddling portion M, from the vertical position at which the article transport vehicle 3 travels along the inter-secondary-path connecting path 22, travel of an article transport vehicle 3 along the primary path 20 and travel of an article transport vehicle 3 along an inter-secondary-path connecting path 22 can be performed without interfering with each other.

The article transport facility in accordance with the present invention is further described next with reference to FIGS. 2, and 4-9 in which the primary path 20 is referred to as the first travel path: the inter-secondary-path connecting paths 22 are referred to as the second travel paths: and the secondary paths 21 are referred to as the third travel paths.

Figure 4:
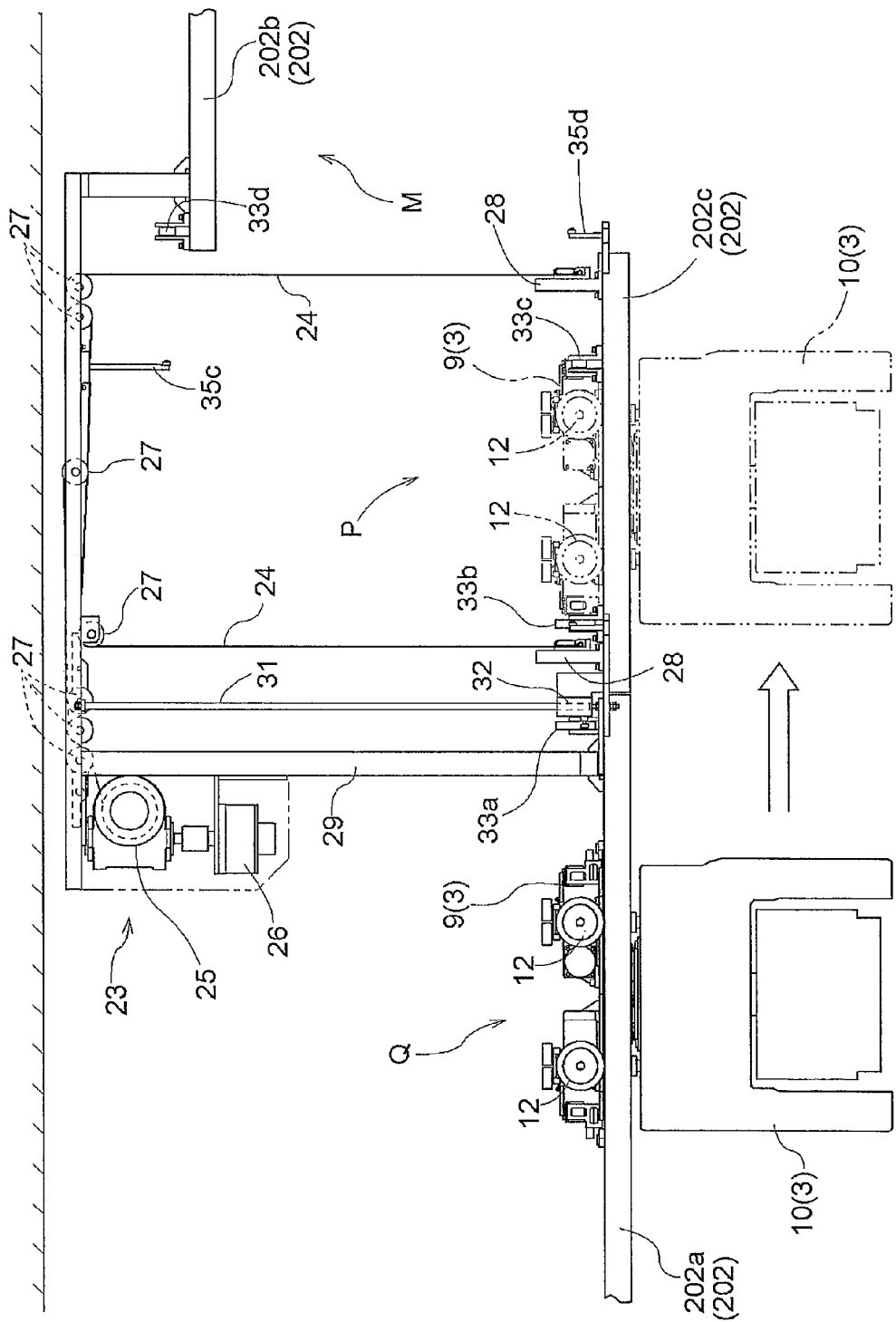
FIG. 4 is an expanded view of a part of what is shown in FIG. 2.
Figure 5:
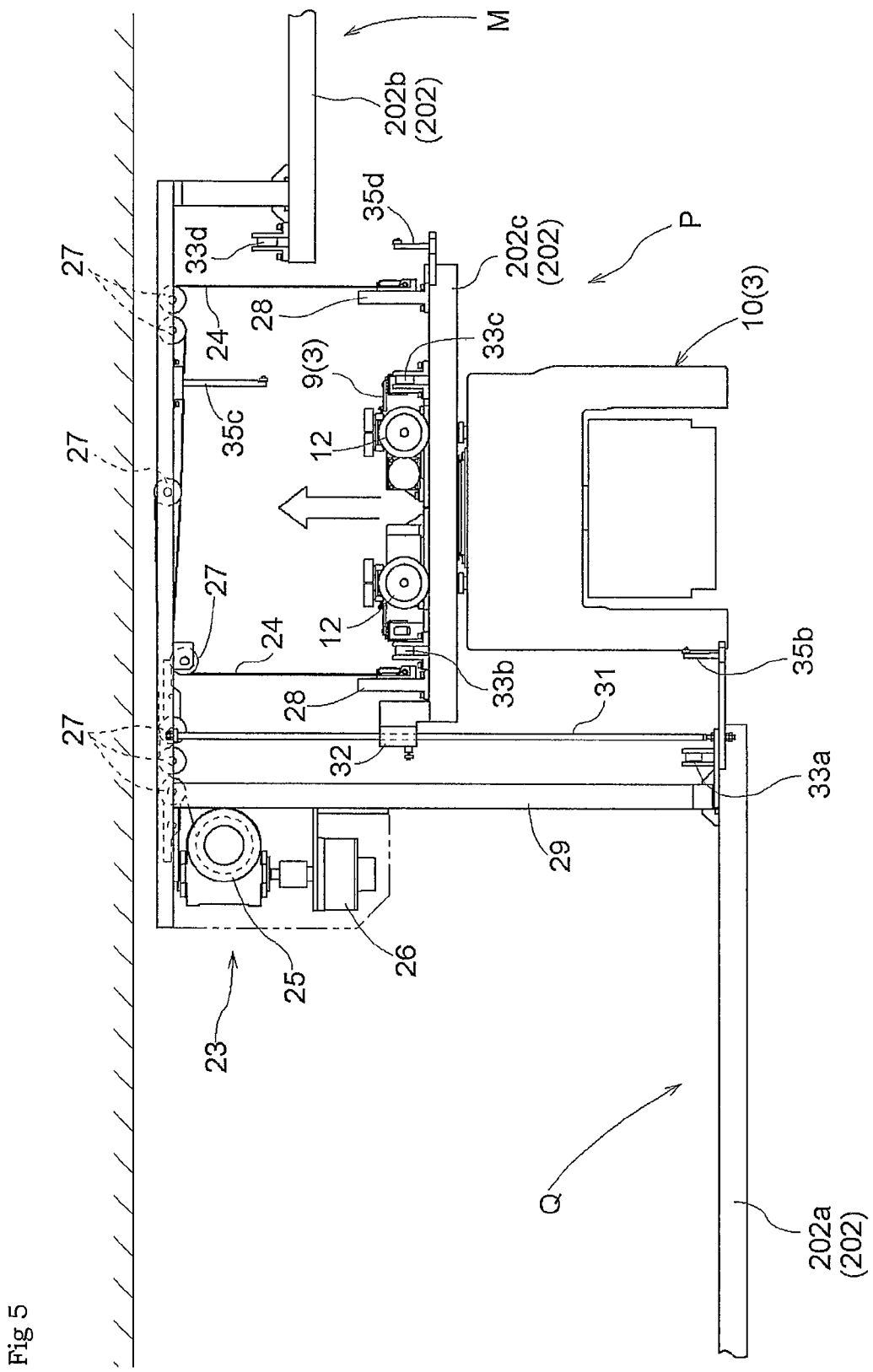
FIG. 5 is an expanded view of a part of what is shown in FIG. 2.
Figure 6:
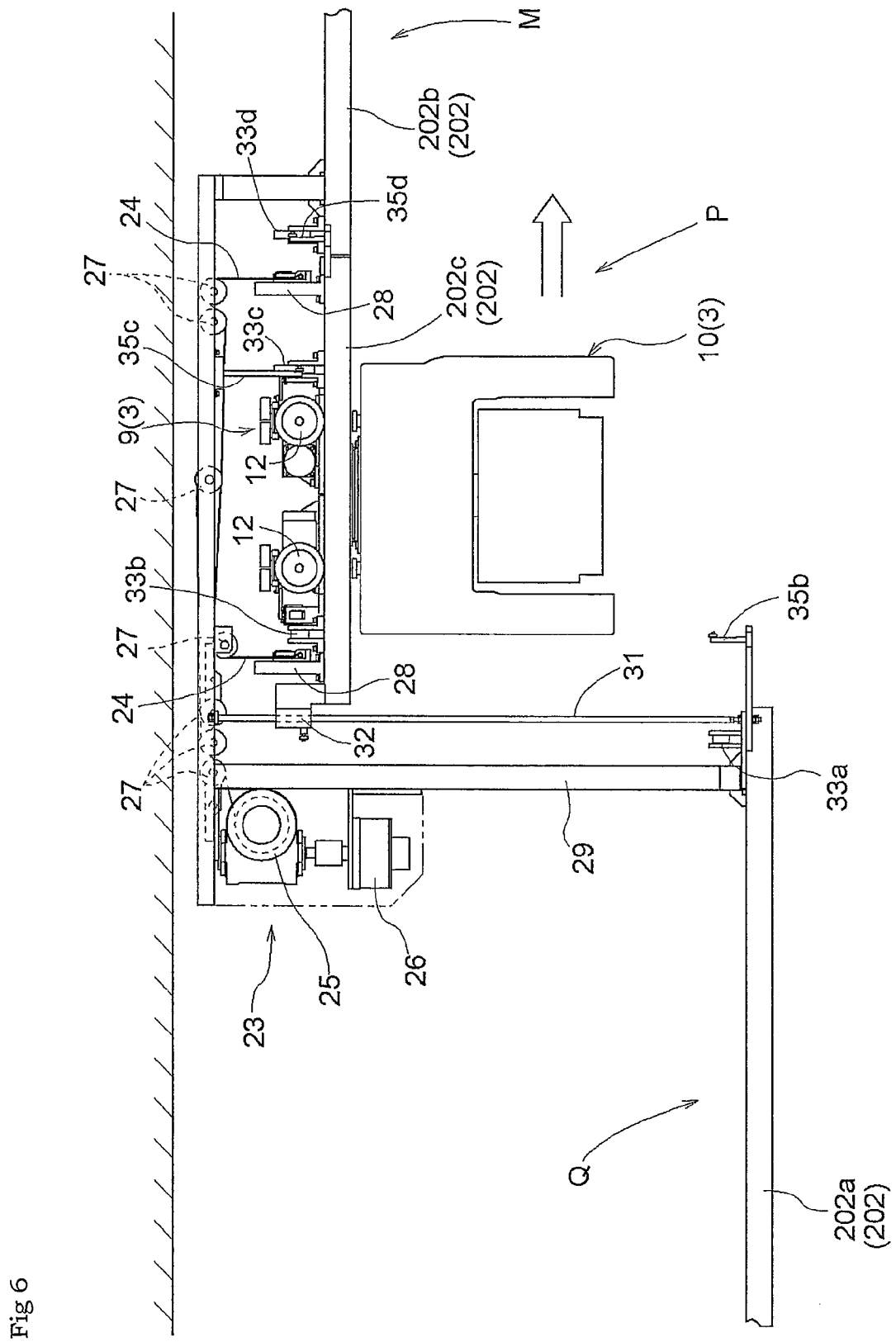
FIG. 6 is an expanded view of a part of what is shown in FIG. 2.
Figure 7:
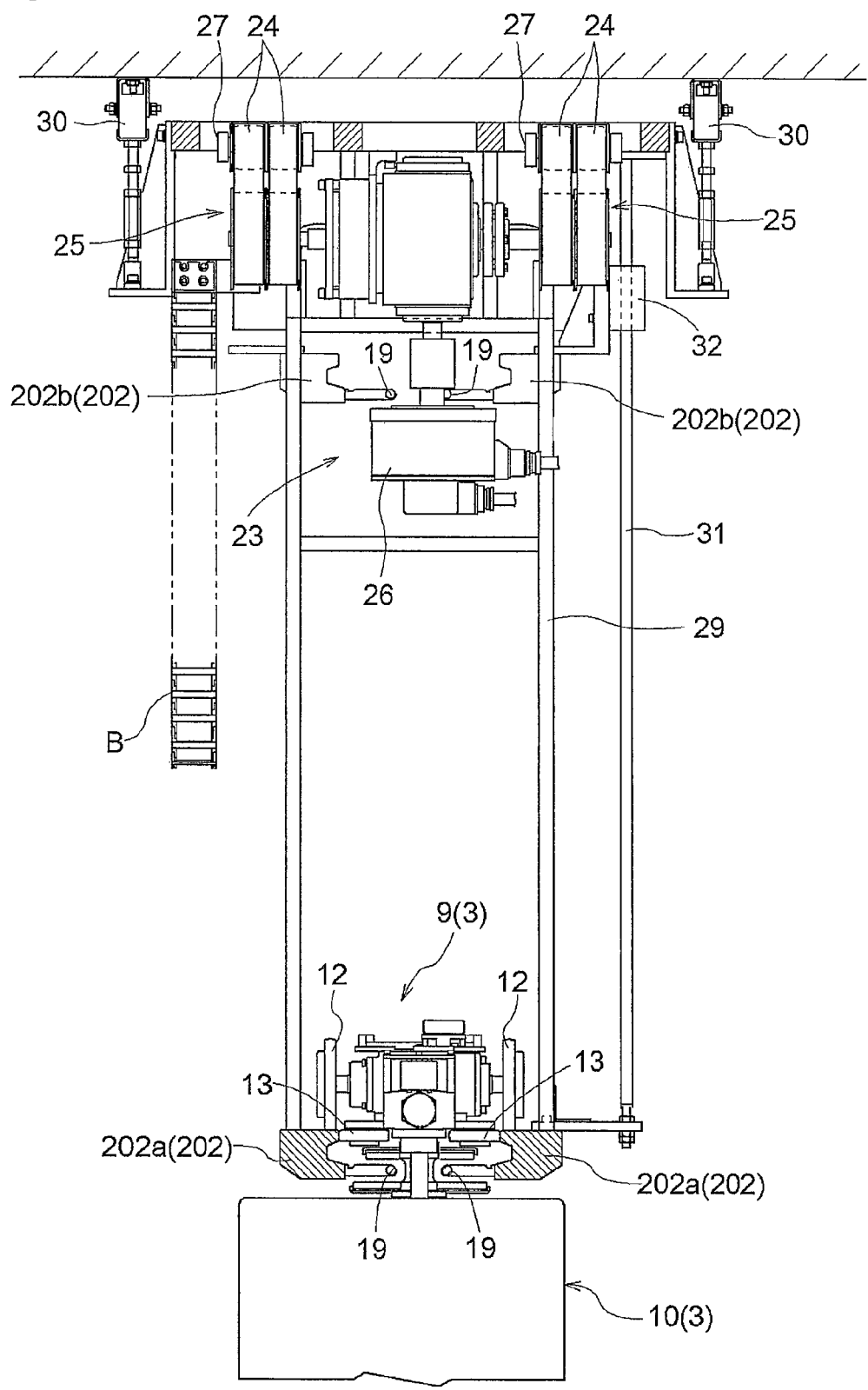
FIG. 7 is a sectional view of a connecting path between secondary paths.
Figure 8:
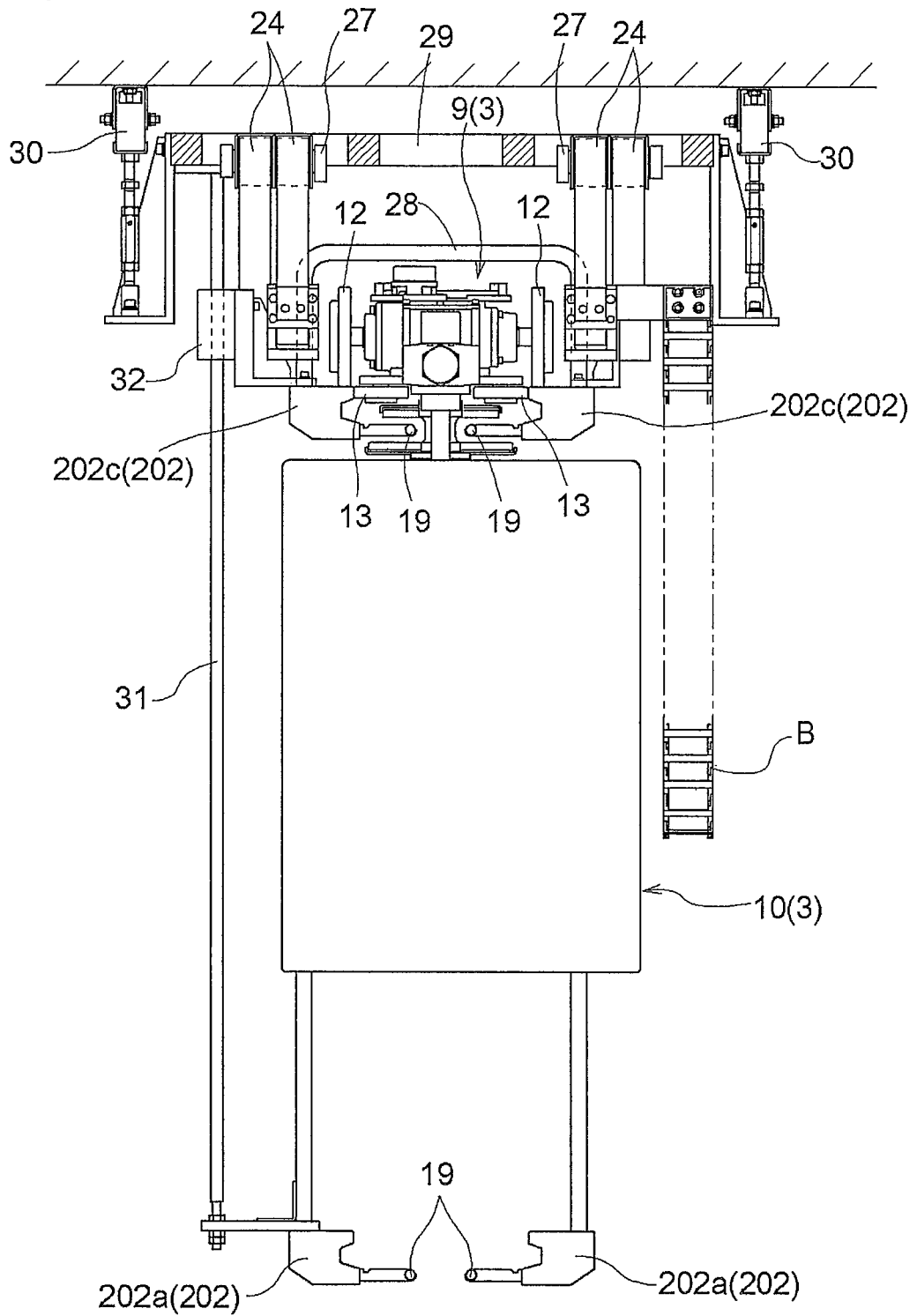
FIG. 8 is a sectional view of the connecting path between secondary paths.
Figure 9:
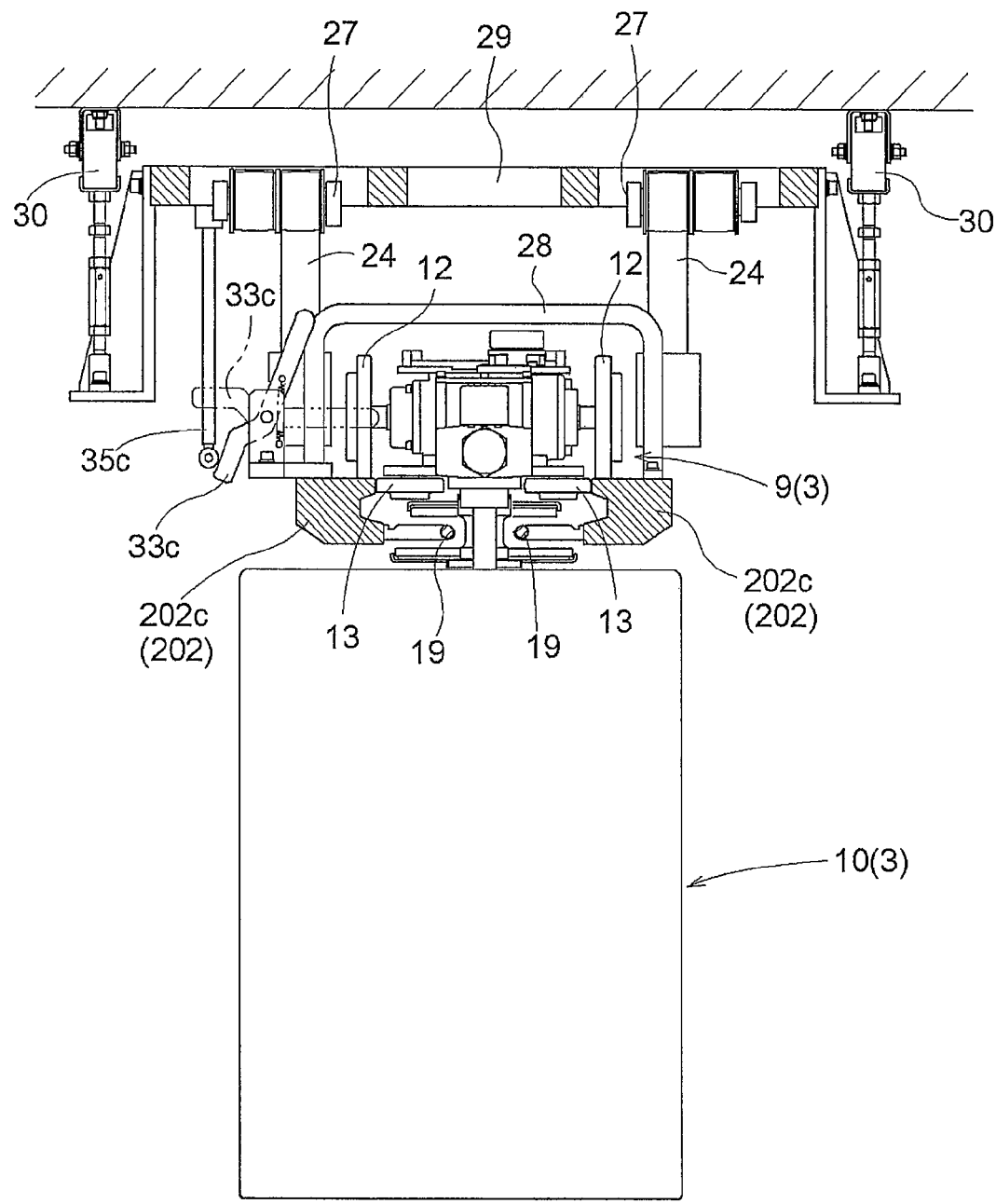
FIG. 9 is a sectional view of the connecting path between secondary paths.

FIG. 2 is a side schematic view of an inter-secondary-path connecting path 22 including the straddling portions M. FIGS. 4-6 are expanded views of a principal portion of what is shown in FIG. 2 and show a traveling process of an article transport vehicle 3. And FIGS. 7-9 are sectional views of the principal portion of the inter-secondary-path connecting path 22. FIG. 7 is a sectional view as seen in the travel direction X of the article transport vehicle 3 in FIG. 2. FIG. 8 is a sectional view as seen from the opposite direction to the travel direction X of the article transport vehicle 3 in FIG. 2.

As shown in FIG. 2, the inter-secondary-path connecting paths 22, which function as the second travel paths, are located upwardly of the primary path 20 in the straddling portions M, such that travel of an article transport vehicle 3 along the primary path 20 and travel of an article transport vehicle 3 along the inter-secondary-path connecting path 22 are mutually allowed. Here, in FIG. 2, the primary path 20 is shown as travel paths which allow the article transport vehicle 3 to travel along a direction perpendicular to the plane of the paper whereas the inter-secondary-path connecting path 22 is shown as a travel path which allows the article transport vehicle 3 to travel in the direction indicated by the arrow X.

To describe in more detail, first travel rails 201 which define the primary path 20 and second travel rails 202 which define the inter-secondary-path connecting path 22 are provided as the travel rails 2. The first travel rails 201 are provided as a pair of right and left rails which are spaced apart from each other in the lateral direction of the article transport vehicle 3. As shown in FIGS. 7 and 8, the second travel rails 202 are also provided as a pair of right and left rails which are spaced apart from each other in the lateral direction of the article transport vehicle 3. Although the pair of right and left straight portions of the first travel rails 201 are spaced apart from each other as shown in FIG. 1, the portion between the pair of right and left straight portions is omitted in FIG. 2.

Referring to FIG. 2 again, the second travel rails 202 that define the inter-secondary-path connecting path 22 include first height rail portions 202a which are on the upstream side and on the downstream side of the primary path 20 in the travel direction X of the article transport vehicle 3 (i.e., on one side and the other side of the primary path 20 in the lateral direction) and which are located at the same height in the vertical direction as the first travel rails 201, second height rail portions 202b which are located such as to have an upwardly different height from (i.e., at a higher position than) the first travel rails 201 in the straddling portion M, and vertically movable rail portions 202c which are located between the straddling portion M and the upstream side of the primary path 20 as well as between the straddling portion M and the downstream side in the travel direction X of the article transport vehicle 3 and which can be vertically moved by vertically moving devices 23 between a first height at which the vertically movable rail portions 202c are in series with the first height rail portions 202a (see FIG. 4) and a second height at which the vertically movable rail portions 202c are in series with the second height rail portions 202a (see FIG. 5).

Incidentally, while not shown, the primary path 20 which functions as the first travel path and the secondary paths 21 which function as the third travel paths are arranged such that they are at the same height in the vertical direction. In addition, the connecting paths for connecting the primary path 20 and the secondary paths 21 are arranged such that they are at the same height as the primary path 20 and the secondary paths 21 in the vertical direction. This allows the article transport vehicle 3 to travel smoothly at the same height without having to change the height at which it travels, when diverging from the primary path 20 to a secondary path 21 via a connecting path, and when converging from a secondary path 21 to the primary path 20 via a connecting path.

Referring to FIG. 2 again, the straddling portion M in an inter-secondary-path connecting path 22 is set up such that it straddles both of the pair of straight portions of the primary path 20 in succession. The second height rail portions 202c are provided in this straddling portion M. More specifically, the second height rail portions 202c have one end portions on one side and the other end portions on the other side in the travel direction X. And the distance between the one side end portion and the other side end portion (i.e., the length of the second height rail portions 202c) is greater than the distance between the pair of straight portions of the primary path 20. Further, the end portions on one side are located beyond one of the pair of straight portions of the primary path 20 in the travel direction X in plan view and the end portions on the other side are located beyond the other of the pair of straight portions of the primary path 20 in the travel direction X. And a portion adjacent the straddling portion M and on each side of the straddling portion M with the straddling portion located between two such portions in the travel direction X of the article transport vehicle 3 is defined to be an adjacent portion P. In other words, one adjacent portion P is provided adjacent to one side ends of the second height rail portions 202c and another adjacent portion P is provided adjacent to the other side ends of the second height rail portions 202c. Each adjacent portion P on each side is set, for example, to be a portion extending from the straddling portion M by a set distance toward the secondary path 21 in the travel direction X of the article transport vehicle 3. Here, the set distance is set to be a distance longer than the fore and aft length of the article transport vehicle 3 so that the article transport vehicle 3 can be accommodated within this adjacent portion P. The vertically movable rail portions 202c are arranged in the adjacent portion P on each side. In addition, a portion, which is on each side with the straddling portion M located between the two sides in the travel direction X of the article transport vehicle 3 and which is spaced apart from the adjacent portion P toward the secondary path 21, is set up as a spaced-apart portion Q. The first height rail portions 202a are arranged in the spaced-apart portion Q on each side.

As described above, the second height rail portions 202b provided in the straddling portion M are located at a higher position than the first travel rails 201. And the second height rail portions 202b are located at a position that is spaced apart upwardly from the first travel rails 201 by a distance greater than the vertical width of the article transport vehicle 3 traveling along the second height rail portions 202b. Thus, travel of the article transport vehicle 3 along the first travel rails 201 and travel of the article transport vehicle 3 along the second height rail portions 202b are mutually allowed without the article transport vehicle 3 traveling along the first travel rails 201 and the article transport vehicle 3 traveling along the second height rail portions 202b interfering with each other. As a result, the travel of the article transport vehicle 3 along the first travel rails 201 and the travel of the article transport vehicle 3 along the second height rail portions 202b can be performed independently of each other.

The structure of the vertically moving device 23 for vertically moving the vertically movable rail portions 202c are described next, among other things. As described above, the vertically movable rail portions 202c are provided on both sides, i.e., the upstream side and the downstream side, of the straddling portion M in the travel direction X of the article transport vehicle 3. The vertically movable rail portions 202c on the upstream side in the travel direction X of the article transport vehicle 3 and the vertically movable rail portions 202c on the downstream side have the identical structure except that their arrangements are opposite from each other in the travel direction X of the article transport vehicle 3. Thus, the following additional descriptions are provided only for the ones on the upstream side in the travel direction X of the article transport vehicle 3 with reference to FIGS. 4-9.

As shown in FIGS. 4 and 7, the vertically moving device 23 for vertically moving the vertically movable rail portions 202c between the first height and the second height includes a spooling and feeding out device 25 which can spool and feed out suspending belts 24 for suspending and supporting the vertically movable rail portions 202c and an electric motor 26 (which functions as an actuator) for causing the spooling and feeding out device 25 to perform the spooling operation and the feed out operation. And four suspending belts 24 are provided with each having an end portion connected to the spooling and feeding out device 25 and intermediate portions wound around or run over a number of rotation guide bodies 27, and the other end portion connected to the vertically movable rail portion 202c. With regard to how the suspending belts 24 are connected to the vertically movable rail portions 202c, the suspending belts 24 are not directly connected to the vertically movable rail portion 202c, but are connected to the vertically movable rail portions 202c through connecting members 28 as shown in FIGS. 4 and 9. In other words, a pair of right and left vertically movable rail portions 202c are provided which are spaced apart from each other in the lateral direction of the article transport vehicle 3. And the pair of right and left vertically movable rail portions 202c are connected to each other by the connecting member 28. The connecting member 28 has a general overall shape of a bracket, and includes a portion that extends upwardly from each of the pair of right and left vertically movable rail portions 202c and a straight portion which connects the upper end portions of the portions that extend. Thus, by connecting the suspending belts 24 to the connecting member 28 and by spooling and feeding out the suspending belts 24, the pair of right and left vertically movable rail portions 202c can be moved vertically with the vertically movable rail portions 202c remaining spaced apart from each other in the lateral direction of the article transport vehicle 3. And the connecting member 28 connects the pair of right and left vertically movable rail portions 202c with each other and is formed to define a space through which the travel drive portion 9 of the article transport vehicle 3 can pass.

Thus, the vertically moving device 23 is configured to vertically move the pair of right and left vertically movable rail portions 202c between the first height (see FIG. 4) and the second height (see FIG. 6) by causing the spooling and feeding out device 25 to perform the spooling operation or feeding out operation using the driving force of the electric motor 26 to spool or feed out the four suspending belts 24. Here, a vertically extending bar-shaped vertical movement guide 31 is provided, as shown in FIGS. 4-6, to prevent displacement or swaying, etc., of the vertically movable rail portions 202c during the vertical movement when vertically moving the vertically movable rail portion 202c by the vertically moving device 23. The vertically movable rail portions 202c are provided with a sliding body 32 which can be vertically moved integrally with the vertically movable rail portions 202c and which is fit onto and can slide along the vertical movement guide 31. Thus, the vertically movable rail portions 202c are vertically moved while being guided by the vertical movement guide 31 by virtue of the fact that the sliding body 32 is fit onto and slide along the vertical movement guide 31.

As shown in FIGS. 5 and 7, the vertically moving device 23 is supported by upper end side portions of support bodies 29 which are formed in the shape of a frame. The support bodies 29 are suspended from and supported by the ceiling portion by the suspending supports 30. And the first height rail portions 202a are fixed to the lower end portions of the support bodies 29. The support bodies 29 are located in the spaced-apart portion Q and above the first height rail portions 202a. And the spooling and feeding out device 25 and the electric motor 26, among other things, of the vertically moving device 23 are located such that they are accommodated within a space which spans, in the vertical direction, a vertical movement range in which the vertically movable rail portion 202c is vertically moved between the first height and the second height and between the pair of right and left second travel rails 202 of the inter-secondary-path connecting paths 22 in the lateral direction (i.e., lateral direction of the article transport vehicle 3). Thus, the spooling and feeding out device 25 and the electric motor 26, etc., can be installed efficiently in small space while effectively utilizing the space above the vertically movable rail portions 202c in the spaced-apart portion Q as the installation space for the spooling and feeding out device 25 and electric motor 26, etc.

Operations that are performed when the article transport vehicle 3 travels in the straddling portion M in the inter-secondary-path connecting path 22 are described next.

As shown in FIG. 2, the inter-secondary-path connecting path 22 is provided with the vertically movable rail portion 202c on both the upstream side and the downstream side of the straddling portion M in the travel direction X of the article transport vehicle 3. And when the article transport vehicle 3 travels in the straddling portion M, as an initial state, the vertically movable rail portions 202c on the upstream side are located at the first height at which the vertically movable rail portions 202c are in series with the first height rail portions 202a whereas the vertically movable rail portions 202c on the downstream side are located at the second height in which the vertically movable rail portions 202c are in series with the second height rail portions 202b. Thus, as shown in FIG. 4, the article transport vehicle 3 travels along the first height rail portions 202a provided in the spaced-apart portion Q, and moves from the first height rail portions 202a onto the vertically movable rail portions 202c in the adjacent portion P and located at the first height before being stopped in the vertically movable rail portions 202c. And as shown in FIG. 5, the vertically movable rail portions 202c onto which the article transport vehicle 3 has moved are raised from the first height by the vertically moving device 23. And as shown in FIG. 6, the vertically movable rail portions 202c onto which the article transport vehicle 3 has moved are raised to the second height at which the vertically movable rail portions 202c are in series with the second height rail portions 202b provided in the straddling portion M. Subsequently, the article transport vehicle 3 travels along the vertically movable rail portions 202c and moves onto the second height rail portions 202b provided in the straddling portion M. And, because the second height rail portions 202b are located at a higher position than the first travel rails 201 as described above, the article transport vehicle 3 can travel along the second height rail portions 202b independently of the travel of an article transport vehicle 3 along the first travel rail 201 in the primary path 20.

As such, when the article transport vehicle 3 has travelled along the second height rail portions 202b provided in the straddling portion M after having travelled along the first height rail portions 202a provided in the spaced-apart portion Q and then along the vertically movable rail portions 202c provided in the adjacent portion P in that order in the upstream side of the straddling portion M in the travel direction X of the article transport vehicle 3, the article transport vehicle 3 moves on to travel, similarly on the downstream side of the straddling portion M in the travel direction X of the article transport vehicle 3, along the vertically movable rail portions 202c provided in the adjacent portion P and then along the first height rail portions 202a provided in the spaced-apart portion Q in that order. In other words, while not shown, the article transport vehicle 3 moves from the second height rail portions 202b provided in the straddling portion M and onto the vertically movable rail portions 202c provided in the adjacent portion P and located at the second height. Then the vertically movable rail portions 202c onto which the article transport vehicle 3 has moved are lowered from the second position to the first position by the vertically moving device 23. Then, the article transport vehicle 3 moves from the vertically movable rail portions 202c onto the first height rail portions 202a and keeps on traveling.

As described above, the article transport vehicle 3 is configured to be able to travel along the inter-secondary-path connecting path 22 sequentially from the first height rail portions 202a and the vertically movable rail portions 202c on one side in the lateral direction of the primary path 20 and then through the second height rail portions 202b in the straddling portion M and along the vertically movable rail portions 202c and the first height rail portions 202a on the other side in the lateral direction of the primary path 20. And, as shown in FIGS. 7 and 8, a pair of right and left electricity supply lines 19 that are supported by the pair of right and left travel rails 202 are provided to each of the first height rail portions 202a, the second height rail portions 202b, and the vertically movable rail portions 202c of the second travel rails 202 such that the pair of right and left electricity supply lines 19 are installed in the suitable positions at which they can supply driving electric power to the power receiving coil 19 of the article transport vehicle 3. Thus, the article transport vehicle 3 receives supply of driving electric power from the pair of right and left electricity supply lines 19 to travel properly in each of the first height rail portions 202a, the second height rail portions 202b, and the vertically movable rail portions 202c of the second travel rails 202. Although the vertically movable rail portions 202c are moved vertically between the first height and the second height, the electricity supply lines 19 supported by the vertically movable rail portions 202c are configured to supply driving electric power to the article transport vehicle 3 when located at the first height and when located at the second height by the use of a cableveyor B, etc.

Incidentally, regarding the vertically movable rail portions 202c, when the article transport vehicle 3 moves onto the next rail portions, the vertically movable rail portions 202c are vertically moved by the vertically moving device 23 so that they are in the initial state in which the vertically movable rail portions 202c on the upstream side in the travel direction of the article transport vehicle 3 are located at the first height in which the vertically movable rail portions 202c are in series with the first height rail portions 202a and in which the vertically movable rail portions 202c on the downstream side are located at the second height in which the vertically movable rail portions 202c are in series with the second height rail portions 202b.

And, as shown in FIGS. 4-6, stoppers 33a-33d for restricting movement of the article transport vehicle 3 are provided to prevent the article transport vehicle 3 from traveling from the first height rail portions 202a toward the vertically movable rail portions 202c when the vertically movable rail portions 202c are not located at the first height or to prevent the article transport vehicle 3 from leaping out of the vertically movable rail portions 202c when the vertically movable rail portions 202c are being vertically moved between the first height and the second height.

Provided as stoppers are first stopper 33a which restricts movement of the article transport vehicle 3 from the first height rail portions 202a toward the vertically movable rail portions 202c, second stopper 33b which restricts movement of the article transport vehicle 3 from the vertically movable rail portions 202c toward the first height rail portions 202a, third stopper 33c which restricts movement of the article transport vehicle 3 from the vertically movable rail portions 202c to the second height rail portions 202b, and fourth stopper 33d which restricts movement of the article transport vehicle 3 from the second height rail portions 202b toward the vertically movable rail portions 202c.

Since all these four stoppers 33a-33d are of the same structure, only the third stopper 33c is described with reference to FIGS. 6 and 9 while descriptions for other stoppers are omitted.

The third stopper 33c includes a plate-shaped member which can be pivoted about an axis extending along the travel direction of the article transport vehicle 3 between a contact position (dotted lines in FIG. 9) for contacting a travel wheel 12 of the article transport vehicle 3 and a retracted position (solid lines in FIG. 9) in which the third stopper 33c is retracted away from the travel wheel 12 of the article transport vehicle 3. And the third stopper 33c contacts the travel wheel 12 to restrict movement of the article transport vehicle 3 when the third stopper 33c is located in the contact position as shown with two dotted lines in FIG. 9, and does not contact the travel wheel 12 so as to allow movement of the article transport vehicle 3 when the third stopper 33c is located in the retracted position as shown with solid lines in FIG. 9. In addition, the third stopper 33c is urged toward the contact position by urging means 34 (e.g., a resilient member such as a coil spring or a leaf spring), and includes a position changing operating portion 35c to change the position of the third stopper 33c from the contact position to the retracted position. The position of the third stopper 33c is changed from the contact position to the retracted position by pushing the third stopper 33c with the position changing operating portion 35c. The position changing operating portion 35c for the third stopper 33c extends downwardly from the support body 29 which supports the vertically moving device 23. And the position changing operating portion 35c is configured to push the third stopper 33c when the vertically movable rail portion 202c is raised to the second height. Incidentally, with respect to the position changing operating portion in FIGS. 4-6, only the position changing operating portions 35b, 35d for the second and fourth stoppers 33b, 33d are shown and the position changing operating portion for the first stopper 33a is omitted.

To describe the operations of the first-the fourth stoppers 33a-33d, as shown in FIG. 4, the first and second stoppers 33a, 33b are in their retracted positions when the vertically movable rail portions 202c are located in the first height to allow movement of the article transport vehicle 3 from the first height rail portions 202a to the vertically movable rail portions 202c. This allows the article transport vehicle 3 to move from the first height rail portions 202a onto the vertically movable rail portions 202c located at the first height. And, at this time, the third and fourth stoppers 33c, 33d are in their contact positions to restrict movement of an article transport vehicle 3 from the second height rail portions 202b toward the vertically movable rail portions 202c in order to prevent the article transport vehicle 3 from being accidentally moved from the second height rail portions 202b toward the vertically movable rail portions 202c.

As shown in FIG. 6, the third and fourth stoppers 33c, 33d are in their retracted positions when the vertically movable rail portions 202c are located at the second height to allow movement of the article transport vehicle 3 from the vertically movable rail portions 202c to the second height rail portions 202b. This allows the article transport vehicle 3 to move from the vertically movable rail portions 202c located at the second height onto the second height rail portions 202b. And, at this time, the first and second stoppers 33a, 33d are in their contact positions to restrict movement of the article transport vehicle 3 from the second height rail portions 202b toward the vertically movable rail portions 202c in order to prevent the article transport vehicle 3 from being accidentally moved from the first height rail portions 202a toward the vertically movable rail portions 202c.

In addition, as shown in FIG. 5, all of the first-fourth stoppers 33a-33d are in their contact positions during a vertical movement of the vertically movable rail portion 202c between the first height and the second height to prevent an article transport vehicle 3 from leaping out of the vertically movable rail portions 202c or from being accidentally moved toward the vertically movable rail portions 202c.

Alternative Embodiments (1) In the embodiment described above, an example is described in which the vertically movable rail portions 202c which can be vertically moved between the first height and the second height are provided to allow the article transport vehicle 3 to travel between the first height rail portions 202a and the second height rail portions 202b. However, in place of the vertically movable rail portions, inclined rail portions may be provided which are inclined to connect together the first height rail portions and the second height rail portions. In such case, on the upstream side of the straddling portion in the travel direction of the article transport vehicle, the article transport vehicle travels from the first height rail portions to the inclined rail portions, then along the inclined rail portion to climb gradually upwardly from the lower side to the upper side of the inclined rail portions, and then from the inclined rail portions to the second height rail portions. And on the downstream side of the straddling portion in the travel direction of the article transport vehicle, the article transport vehicle travels from the second height rail portions to the inclined rail portions, then along the inclined rail portion to descend gradually downwardly from the upper side to the lower side of the inclined rail portions, and then from the inclined rail portions to the first height rail portions.

(2) In the embodiment described above, the inter-secondary-path connecting path 22 which is the second travel path is located at a higher position than the primary path 20 which is the first travel path in the straddling portion M. However, the inter-secondary-path connecting path 22 which is the second travel path may be located at a lower position than the primary path 20 which is the first travel path. More specifically, it is more effective to provide the second travel path at a higher position than the first travel path when there is space above the first travel rails that define the first travel path whereas it is more effective to provide the second travel path at a lower position than the first travel path when there is space below the first travel rails that define the first travel path.

(3) In the embodiment described above, an example is described in which, in the facility in which the secondary paths 21 which are the third travel paths are provided on one side as well as the other side of the primary path 20 which is the first travel path, a inter-secondary-path connecting path 22 which connects a secondary path 21 of one side of the primary path 20 with a secondary path 21 on the other side is designated as the second travel path. However, the article transport facility in accordance with the present invention can be applied to any facility as long as it has a second travel path that straddles a first travel path from one side of the first travel path to the other side.

INDUSTRIAL APPLICABILITY

The article transport facility in accordance with the present invention may be utilized in such facility as a manufacturing factory or a processing facility, etc. for semiconductors.

DESCRIPTION OF REFERENCE NUMERALS AND SYMBOLS

2 Travel Rail
3 Article Transport Vehicle
20 First Travel Path
21 Third Travel Path
22 Second Travel Path
23 Vertically Moving Device
26 Actuator
201 First Travel Rail
202 Second Travel Rail
202a First Height Rail Portion
202b Second Height Rail Portion
202c Vertically Movable Rail Portion
M Straddling Portion

The invention claimed is:

1. An article transport facility comprising:
at least two travel paths including a first travel path and a second travel path which straddles the first travel path from one side to the other side in a lateral direction of the first travel path;
an article transport vehicle capable of traveling along the travel paths;
wherein
in a straddling portion, which is a part of the second travel path that straddles the first travel path, the second travel path is provided at a different height from the first travel path in a vertical direction and is configured such that travel of the article transport vehicle along the first travel path and travel of the article transport vehicle along the second travel path are mutually allowed, wherein the article transport vehicle is configured to be able to travel along the second travel path sequentially from one side in the lateral direction of the first travel path, through the straddling portion, and to an other side in the lateral direction of the first travel path, and wherein a first travel rail which defines the first travel path and a second travel rail which defines the second travel path are provided, wherein the second travel rail includes a first height rail portion provided on the one side and the other side in the lateral direction of the first travel path and at a same height as the first travel rail in the vertical direction, a second height rail portion provided in the straddling portion at a different height from the first travel rail in the vertical direction, and a vertically movable rail portion which can be vertically moved by a vertical mover between a first height at which the vertically movable rail portion is in series with the first height rail portion and a second height at which the vertically movable rail portion is in series with the second height rail portion, wherein the vertically movable rail portion is provided between the straddling portion and the one side in the lateral direction of the first travel path and between the straddling portion and the other side in the lateral direction of the first travel path.

2. The article transport facility as defined in claim 1, wherein the at least two travel paths further include a third travel path provided on the one side of the first travel path and a third travel path provided on the other side of the first travel path, in the lateral direction, and wherein the second travel path has one end portion thereof connected to the third travel path that is provided on the one side in the lateral direction of the first travel path, and the other end thereof connected to the third travel path that is provided on the other side in the lateral direction of the first travel path so as to allow the article transport vehicle to travel between the third travel path that is provided on the one side and the third travel path that is provided on the other side in the lateral direction of the first travel path.

3. The article transport facility as defined in claim 1, wherein the first travel rail and the second travel rail are provided as a pair of right and left first travel rails and a pair of right and left second travel rails respectively, wherein the vertical mover is configured to be able to vertically move the vertically movable rail portion between the first height and the second height using driving force of an actuator, and wherein the actuator is accommodated in space on a side in which the first height rail portion is provided with respect to the vertically movable rail portion in the lateral direction of the first travel path, and within the range of vertical movement in which the vertically movable rail portion is vertically moved between the first height and the second height in the vertical direction, and between the pair of right and left second travel rails in the lateral direction of the second travel path.

4. The article transport facility as defined in claim 1, wherein a stopper for restricting movement of the article transport vehicle is provided at least in the vertically movable rail portion, wherein the stopper can be moved between a contact position for restricting passage of the article transport vehicle and a retracted position for allowing passage of the article transport vehicle, and wherein the stopper is configured to be moved from the contact position to the retracted position by contacting a position changing operating portion supported on a ceiling side when the vertically movable rail portion reaches the second height.

5. The article transport facility as defined in claim 1, wherein the first travel path is a looped path.

6. The article transport facility as defined in claim 2, wherein each of the third travel path on the one side and the third travel path on the other side include a looped path.

7. The article transport facility as defined in claim 2, wherein for each of the third travel path provided on the one side of the first travel path and the third travel path provided on the other side of the first travel path, there are provided:

a diverging path connecting the first travel path with one of the second travel path and the third travel path for allowing the article transport vehicle to diverge from the first travel path to the third travel path; and a merging path connecting the first travel path with one of the second travel path and the third travel path for allowing the article transport vehicle to merge from the third travel path to the first travel path.

\* \* \* \* \*